(12) United States Patent
Kim et al.

(10) Patent No.: US 9,691,769 B2
(45) Date of Patent: Jun. 27, 2017

(54) MEMORY DEVICE HAVING BURIED GATE AND METHOD OF FABRICATING THE SAME

(71) Applicant: SAMSUNG ELECTRONICS CO., LTD., Suwon-si, Gyeonggi-do (KR)

(72) Inventors: Yongjun Kim, Suwon-si (KR); Keeshik Park, Hwaseong-si (KR); Jungwoo Song, Hwaseong-si (KR); Sang-Jun Lee, Incheon (KR); Donggyun Han, Yongin-si (KR); Jaerok Kahng, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/810,739

(22) Filed: Jul. 28, 2015

(65) Prior Publication Data
US 2016/0149008 A1    May 26, 2016

(30) Foreign Application Priority Data
Nov. 24, 2014  (KR) .................. 10-2014-0164678

(51) Int. Cl.
*H01L 21/02* (2006.01)
*H01L 21/00* (2006.01)
*H01L 27/108* (2006.01)
*H01L 27/11521* (2017.01)

(52) U.S. Cl.
CPC .. *H01L 27/10814* (2013.01); *H01L 27/10817* (2013.01); *H01L 27/10823* (2013.01); *H01L 27/10855* (2013.01); *H01L 27/10876* (2013.01); *H01L 27/11521* (2013.01)

(58) Field of Classification Search
CPC .................................. H01L 27/11521
USPC ................... 257/346, 349; 438/156, 173
See application file for complete search history.

(56) References Cited

U.S. PATENT DOCUMENTS

| | | | |
|---|---|---|---|
| 8,168,521 B2 | 5/2012 | Jeon et al. | |
| 8,211,804 B2 | 7/2012 | Lee et al. | |
| 8,309,448 B2 | 11/2012 | Hwang et al. | |
| 8,652,897 B2 * | 2/2014 | Kim | H01L 27/101 257/E47.001 |
| 8,741,755 B2 * | 6/2014 | Nan | H01L 27/10876 438/239 |
| 8,865,594 B2 | 10/2014 | Lee et al. | |
| 8,916,918 B2 * | 12/2014 | Nishi | H01L 27/10826 257/296 |

(Continued)

FOREIGN PATENT DOCUMENTS

| | | |
|---|---|---|
| KR | 10-2010-0104280 A | 9/2010 |
| KR | 10-2011-0013032 A | 2/2011 |

(Continued)

*Primary Examiner* — Calvin Lee
(74) *Attorney, Agent, or Firm* — Lee & Morse, P.C.

(57) ABSTRACT

A memory device includes a substrate including active areas and isolation areas, trenches in the isolation areas, active patterns in the active areas, the active patterns protruding from the substrate, isolation layers filling the trenches, gate trenches crossing the active patterns and the isolation layers, and gate line stacks filling the gate trenches, a first width of the gate trench in the isolation layer being greater than a second width of the gate trench in the active pattern.

17 Claims, 15 Drawing Sheets

(56) References Cited

U.S. PATENT DOCUMENTS

2010/0213541 A1  8/2010  Jeon et al.
2014/0134812 A1  5/2014  Kim et al.

FOREIGN PATENT DOCUMENTS

KR   10-2012-0048903 A   5/2012
KR   10-2012-0104127 A   9/2012

* cited by examiner

MEMORY DEVICE HAVING BURIED GATE AND METHOD OF FABRICATING THE SAME

CROSS-REFERENCE TO RELATED APPLICATION

Korean Patent Application No. 10-2014-0164678, filed on Nov. 24, 2014, in the Korean Intellectual Property Office, and entitled: "Memory Device Having Buried Gate and Method Of Fabricating The Same," is incorporated by reference herein in its entirety.

BACKGROUND

1. Field

Embodiments relate to a memory device in which a buried area of a gate electrode is increased so as to reduce a channel resistance and improve a short channel effect, and a method of fabricating the same.

2. Description of Related Art

With the trend of an increasing degree of integration in the memory devices, patterns disposed in memory cells have been further miniaturized. Therefore, the channel of the transistor also becomes shorter, and thus there is a problem in that a characteristic of the memory device due to a short channel effect is degraded.

SUMMARY

Embodiments provide a memory device in which channel resistance of a transistor and a short channel effect are reduced.

In accordance with an aspect of embodiments, a memory device may include a substrate having active areas and isolation areas, trenches in the isolation areas, active patterns in the active areas, the active areas protruding from the substrate, isolation layers filling the trenches, gate trenches crossing the active patterns and the isolation layers, and gate line stacks filling the gate trenches, a first width of the gate trench in the isolation layer being greater than a second width of the gate trench in the active pattern.

In an embodiment, the active patterns and the isolation layers each may have a plurality of upper surfaces spaced apart by the gate trenches, and the upper surfaces of the active patterns and the upper surfaces of the isolation layers may be alternately disposed along a longitudinal direction of the gate trench. A width of the upper surface of the active pattern may be greater than a width of the upper surface of the isolation layer parallel thereto.

In another embodiment, the gate trench may include a first bottom defined by a surface of the active patterns and a second bottom defined by a surface of the isolation layer. The first bottom may be located at a higher level than the second bottom relative to the substrate. The second bottom may be curved downward more than the first bottom. The gate line stack may include a gate insulating layer conformal along an inside of the gate trench, a gate line having a bottom conformal along a surface of the gate insulating layer, the gate line filling a lower part of the gate trench, and a gate capping layer covering an upper surface of the gate line and filling an upper part of the gate trench. A first source/drain area and a second source/drain area may be formed on the active patterns formed at a first side and a second side of the gate line stack, respectively.

In still another embodiment, the memory device may further include a source line which electrically contacts the first source/drain area and a magnetoresistive device which contacts the second source/drain area. The source line may electrically contact the first source/drain area and the magnetoresistive device may contact the second source/drain area. The magnetoresistive device may include a lower magnetic layer, a tunneling layer, and an upper magnetic layer. A bit line may be electrically connected to the upper magnetic layer.

In yet another embodiment, the memory device may further include a bit line electrically connected to the first source/drain area, and a storage capacitor electrically connected to the second source/drain area. A buried contact may be formed between the second source/drain area and the storage capacitor.

In accordance with another aspect of embodiments, a memory device may include a substrate including an active area and an isolation area, a trench in the isolation area, an active pattern in the active area, the active pattern having a concave part and a convex part which are alternately configured, and an isolation layer filling the trench and having a concave part and a convex part which are alternately configured, a width of a surface of the convex part of the active pattern being greater than a width of a surface of the convex part of the isolation layer parallel thereto.

In an embodiment, the concave part of the active pattern and the concave part of the isolation layer may be alternately formed and integrated. The concave part of the active pattern and the concave part of the isolation layer, which are integrated, may be a gate trench which crosses the trench. The gate trench may include side surfaces of the active pattern, which are perpendicular to a surface of the concave part of the active pattern and extend to a bottom of the trench. The bottom of the concave part of the active pattern may be located at a higher level than a bottom of the concave part of the isolation layer.

In accordance with still another aspect of embodiments, a memory device may include a substrate, a trench which extends in a first direction on the substrate, an isolation layer which fills the trench, gate trenches which extend in a second direction perpendicular to the first direction and have a bottom in which a concave part and a convex part are alternately formed, and gate line stacks which fill the gate trenches. A first width of the gate trench corresponding to the concave part of the gate trench may be greater than a second width of the gate trench corresponding to the convex part parallel thereto. The convex part of the bottom of the gate trench may be a recessed surface of the substrate, and the concave part of the bottom of the gate trench may be a recessed surface of the isolation layer.

In accordance with yet another aspect of embodiments, a memory device may include a substrate including active areas and isolation areas, trenches in the isolation areas along a first direction, active patterns in the active areas along the first direction, the active areas protruding from the substrate, isolation layers filling the trenches, gate trenches crossing the active patterns and the isolation layers in a second direction perpendicular to the first direction, widths of the gate trenches in the first direction in the isolation layers being larger that widths of the gate trenches in the first direction in the active patterns, and gate line stacks filling the gate trenches.

In an embodiment, the isolation layers and the active patterns may alternate in the second direction, the isolation layers exposing sidewalls of the active patterns.

In another embodiment, the gate trenches may be deeper in the isolation layers than in the active patterns, the isolation layers exposing sidewalls of the active patterns defining the gate trenches in the active patterns.

In still another embodiment, a distance between a bottom of each gate trench in the isolation layers and the substrate may be smaller than a distance between a bottom of each gate trench in the active patterns and the substrate.

In yet another embodiment, a bottom of each gate trench in the active patterns may be flat, and a bottom of each gate trench in the isolation layers may be curved, a sidewall of the active pattern between the flat and curved bottoms being covered by a gate insulating layer of a corresponding gate line stack.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
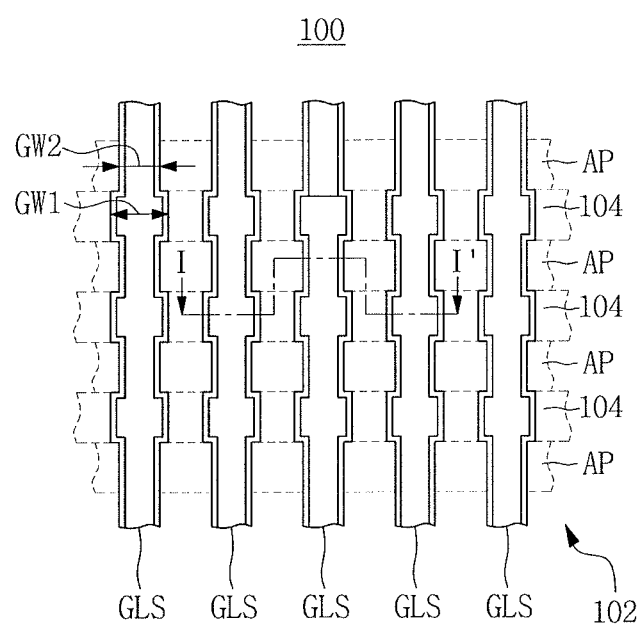
FIG. 1 illustrates a schematic plan view of a cell area of a memory device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. It will also be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In addition, it will also be understood that when a layer is referred to as being "between" two layers, it can be the only layer between the two layers, or one or more intervening layers may also be present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The exemplary embodiments will be described with reference to cross-sectional views and/or plan views, which are ideal exemplary views. Thicknesses of layers and areas may be exaggerated for effective description of the technical contents in the drawings. Forms of the embodiments may be modified by the manufacturing technology and/or tolerance. Therefore, the embodiments are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are not intended to be limited only to those illustrated.

Hereinafter, like reference numerals in the drawings denote like elements. Therefore, although like reference numerals or similar reference numerals are not mentioned or described with respect to a particular drawing, they will be described with reference to other drawings. Further, when reference numerals are not illustrated with respect to a particular drawing, they will be illustrated and described with reference to other drawings.

Terms such as "front side," and "back side" may be used in a relative sense herein to facilitate easy understanding of embodiments. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in a same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

FIG. 1 illustrates a schematic plan view of a cell area of a memory device in accordance with an embodiment. Referring to FIG. 1, a memory device 100 in accordance with an embodiment may include a substrate 102, isolation layers 104, active patterns AP, and gate line stacks GLS.

The isolation layers 104 and the active patterns AP may extend in a first direction, and may be alternately arranged in a second direction perpendicular to the first direction. The gate line stacks GLS may extend in the second direction and may be arranged, e.g., spaced apart from each other, in the first direction. That is, the gate line stacks GLS may extend to cross the isolation layers 104 and the active patterns AP.

A width of the gate line stack GLS in the first direction in a region overlapping the active pattern AP may be different from a width of the gate line stack GLS in the first direction overlapping the isolation layers 104. That is, as illustrated in FIG. 1, a first width GW1 of the gate line stack GLS which crosses the isolation layers 104 may be greater than a second width GW2 of the gate line stack GLS which crosses the active pattern AP. In a configuration of the gate line stack GLS compared with that of the conventional art, a contact resistance of a gate line may be reduced and a channel length may be further ensured. This will be described with reference to FIGS. 2A to 2D.

Figure 2A:
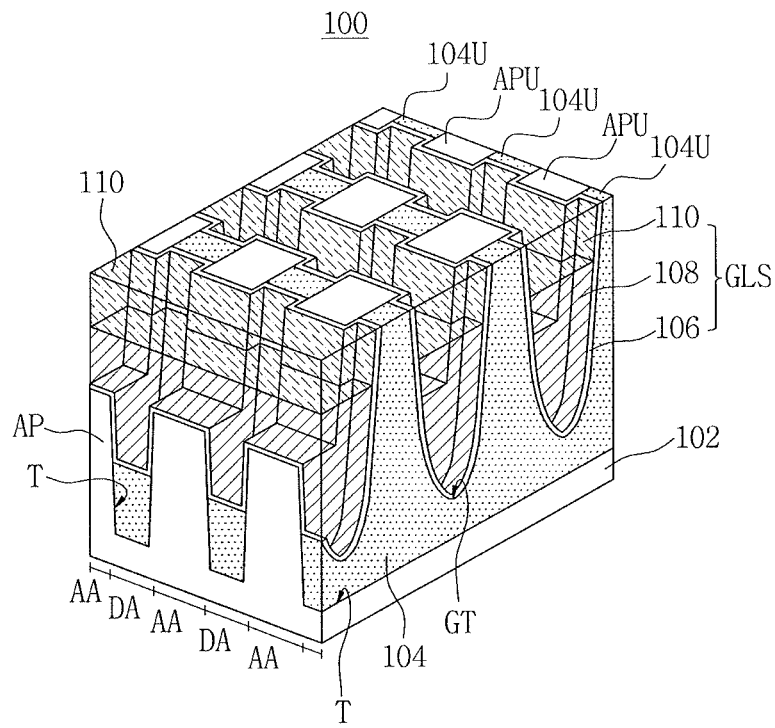
FIG. 2A illustrates a first perspective view of a cell area of a memory device in accordance with an embodiment.
Figure 2B:
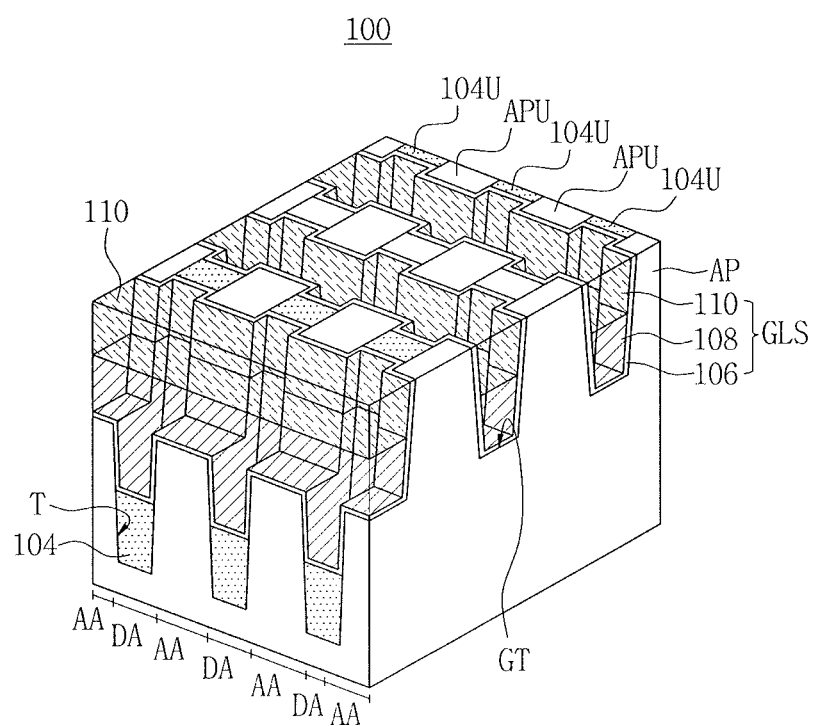
FIG. 2B illustrates a second perspective view of a cell area of the memory device in accordance with an embodiment.
Figure 2C:
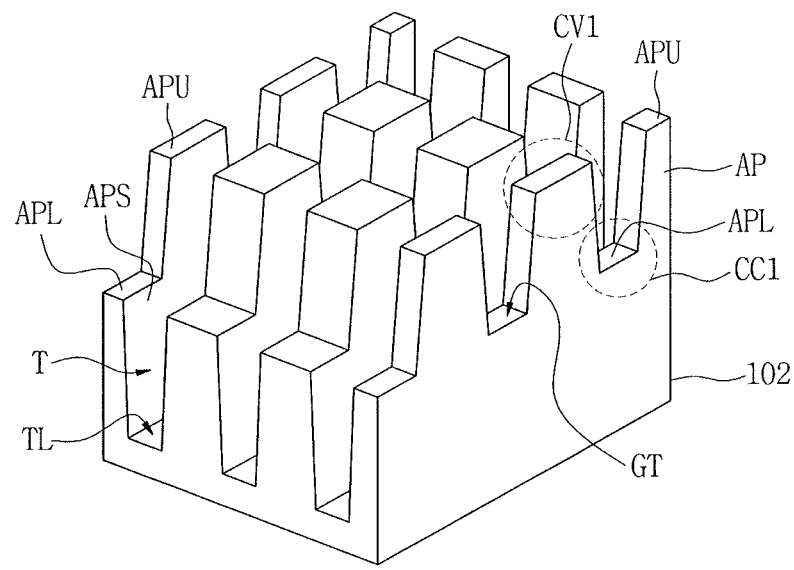
FIG. 2C illustrates a perspective view of only active patterns shown in FIG. 2B.
Figure 2D:
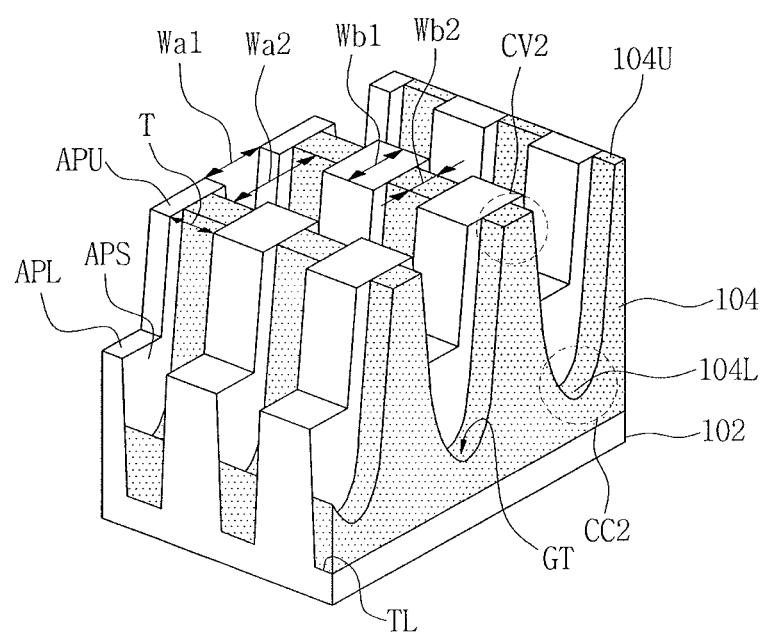
FIG. 2D illustrates a perspective view of a substrate in which gate trenches are formed.

FIG. 2A illustrates a first perspective view of a cell area of the memory device 100. FIG. 2B illustrates a second perspective view of the cell area of the memory device 100. FIG. 2C illustrates a perspective view of only the active patterns AP in FIG. 2B. FIG. 2D illustrates a perspective view of a substrate in which gate trenches are formed.

Referring to FIGS. 2A to 2D, the memory device 100 in accordance with an embodiment may include the substrate 102, the active patterns AP, trenches T formed between the active patterns AP, the isolation layers 104, gate trenches GT, and the gate line stacks GLS. It is noted that while FIG. 2A illustrates a perspective view showing an interior of the isolation layers 104, FIG. 2B illustrates a perspective view showing an interior of the active patterns AP.

Active areas AA and isolation areas DA, which extend in one direction and are alternately formed on the substrate 102, may be defined. For example, the substrate 102 may include a silicon substrate.

For example, as illustrated in FIG. 2C, the active patterns AP may be formed in the active areas AA to protrude from the substrate 102. The trenches T may be formed in the isolation areas DA. The active patterns AP and the trenches T may extend in a first direction and may be spaced apart in a second direction. Inner side walls of the trenches T may be side walls of the active patterns AP. The isolation layers 104 may fill the trenches T (FIG. 2D). The isolation layers 104 may include silicon oxide ($SiO_2$).

The gate trenches GT may extend in the second direction perpendicular to a longitudinal direction of the trenches T, and may be spaced apart in the first direction. The gate trenches GT may be formed to cross the active patterns AP and the isolation layers 104. The gate trenches GT may be parts formed by recessing the active patterns AP and the isolation layers 104.

The gate line stacks GLS may fill the gate trenches GT, as illustrated in FIG. 2A. The gate line stack GLS may include a gate insulating layer 106, a gate line 108, and a gate capping layer 110. The gate insulating layer 106 may be conformally formed along inner walls of the gate trench GT. The gate line 108 and the gate capping layer 110 may be sequentially stacked in the gate trench GT. A surface of the gate capping layer 110 may be at the same level with surfaces of the active pattern AP and the isolation layers 104. For example, as illustrated in FIG. 2A, uppermost surfaces of the gate capping layer 110, the active patterns AP, and the isolation layers 104 may face away from the substrate 102 and may be at the same level with each other. For example, the gate insulating layer 106 may include silicon oxide ($SiO_2$). In another example, the gate insulating layer 106 may include a high-k dielectric. The gate line 108 may include, e.g., tungsten (W), aluminum (Al), copper (Cu), or nickel (Ni). The gate capping layer 110 may include, e.g., silicon oxide ($SiO_2$).

Referring to FIGS. 2C and 2D, the gate trench GT is formed to cross the active patterns AP and the isolation layers 104, and thus the active patterns AP and the isolation layers 104 may have a plurality of spaced-apart upper surfaces APU and 104U. The active pattern AP and the isolation layers 104 each may include a plurality of concave parts CC1 and CC2 and convex parts CV1 and CV2, respectively. Surfaces of the convex parts CV1 and CV2 may be the aforementioned upper surfaces APU and 104U spaced apart from each other. Bottoms of the concave parts CC1 and CC2 of the active pattern AP and the isolation layers 104 may be bottoms of the gate trenches GT. Among the bottoms of the gate trenches GT, a bottom APL of the concave part CC1 formed in the active pattern AP may be curved downward less than a bottom 104L of the concave part CC2 formed in the isolation layers 104.

In detail, the bottom APL of the concave part CC1 of the active pattern AP may be located at a higher level than the bottom 104L of the concave part CC2 of the isolation layers 104 with respect to the substrate 102. That is, as illustrated in FIG. 2D, a distance between the bottom APL of the concave part CC1 and a top of the substrate 102 may be larger than a distance between the bottom 104L of the concave part CC2 and the top of the substrate 102. Therefore, among depths of the gate trenches GT, a depth of the gate trench GT formed in the active pattern AP may be smaller than a depth of the gate trench GT formed in the isolation layers 104, as measured from respective upper surfaces APU and 104U of the active patterns AP and isolation layers 104. In this case, side surfaces APS of the active pattern AP, which are perpendicular to the bottom APL of the concave part CC1 of the active pattern AP and connected to a bottom TL of the trench T (FIG. 2C), are exposed, e.g., above the bottom 104L of the concave part CC2 of the isolation layers 104. Thus, an exposed area of the side surface APS of the active pattern AP may be increased as the depth of the gate trench GT formed in the isolation layers 104 is increased and a width of the gate trench GT formed in the isolation layers 104 along the first direction is increased. This means that an internal area of the gate trench GT may be increased.

As illustrated in FIG. 2D, the width of the gate trench GT in the first direction in accordance with the embodiment may have a first width Wa1 and a second width Wa2. The first width Wa1 of the gate trench GT may be a width of the part formed by recessing the active pattern AP. The second width Wa2 may be a width of the part formed by recessing the isolation layers 104. The second width Wa2 may be greater than the first width Wa1. A width Wb1 of the upper surface APU of the active pattern AP and a width Wb2 of the upper surface 104U of the isolation layers 104 parallel thereto, may be changed according to the width of the gate trench GT.

In detail, the width Wb1 of the upper surface APU of the active pattern AP may be greater than the width Wb2 of the upper surface 104U of the isolation layers 104 parallel thereto. In this case, the second width Wa2 of the gate trench GT may become greater than the first width Wa1 by further performing a selectively cleaning process only on an inner wall of the trench T formed in the isolation layers 104. The process of cleaning only the isolation layers 104 may include a dry cleaning process or a wet cleaning process. The dry cleaning process may include a plasma dry cleaning process.

For example, the plasma dry cleaning process may be a process of removing a silicon oxide layer, which is the isolation layers 104, through a reduction reaction. The plasma dry cleaning process may use $NF_3$ or $NH_3$ gas for the reduction reaction. For example, $NF_3$, $NH_3$, or Ar gas is injected into a plasma generation device, excited to generate plasma, and the generated plasma is supplied to a surface of a substrate, i.e., the isolation layers 104. The oxide layer of the substrate may be reduced through the plasma supplied to the surface of the substrate using the following Reaction formula.

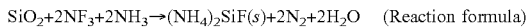

$SiO_2+2NF_3+2NH_3 \rightarrow (NH_4)_2SiF(s)+2N_2+2H_2O$ (Reaction formula)

In the above-described Reaction formula, the products, except $(NH_4)_2SiF(s)$ in a solid form, may be in gas forms. The $(NH_4)_2SiF(s)$ in the solid form may be changed into $(NH_4)_2SiF(g)$ in the gas form through a heat treatment.

The isolation layers 104 may be removed through the above-described cleaning process. Therefore, the width Wa2 of the gate trench GT formed in the isolation layers 104 may be increased.

Further, a bottom of the concave part CC2 of the isolation layers 104 may be further lowered while the inner wall of the gate trench GT, i.e., surfaces of silicon oxide ($SiO_2$) remaining on the surface APS of the active pattern AP and the isolation layers 104 formed between the active patterns AP, is further recessed. Therefore, the exposed area of the side surface APS of the active pattern AP may be further increased.

Due to the above-described results, a contact area between the gate insulating layer 106 and the inner wall of the gate trench GT may be increased and an interfacial characteristic between the gate insulating layer 106 and the inner wall of the gate trench GT may be improved. In detail, a contact area between the gate insulating layer 106 and the side surface APS of the active pattern AP is increased, and thus an effect in which the channel length is further increased may also be obtained. Thus, as the contact area of the gate insulating layer 106 is increased, a contact area and volume of the gate line 108 may be increased. Therefore, a resistance of the gate line 108 may be reduced and a short channel effect may also be reduced.

As described above, a switching device including a buried gate line in which the gate line 108 is buried in the substrate 102 may be applied to a switching device of the memory device. This will be described in more detail below with reference to FIG. 3.

Figure 3:
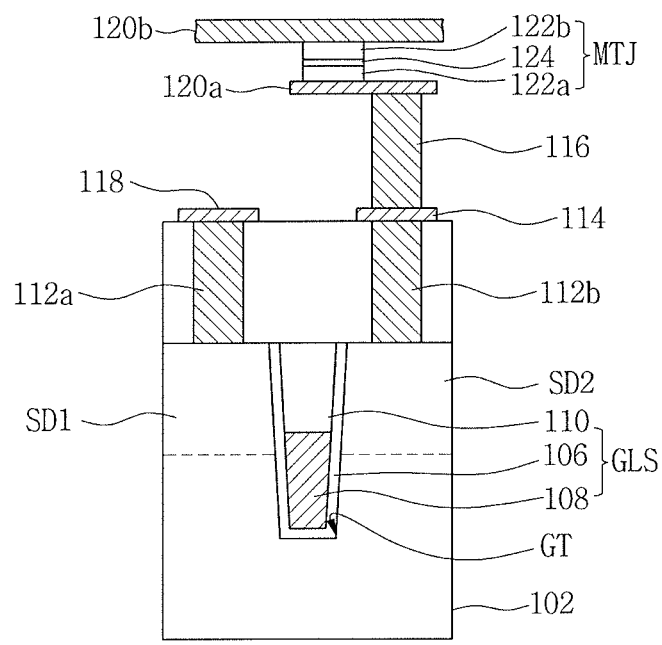
FIG. 3 illustrates a schematic cross-sectional view of a magnetoresistive memory device including a switching device in accordance with an embodiment.

FIG. 3 illustrates a schematic cross-sectional view of a magnetoresistive memory device, e.g., a magnetoresistive random access memory (MRAM), including a switching device in accordance with an embodiment.

Referring to FIG. 3, a magnetoresistive memory device 100a in accordance with an embodiment may include the substrate 102, the gate trench GT, the buried gate line stack GLS, a first source/drain contact 112a, a source line 118, a second source/drain contact 112b, a bypass line 120a, a magnetoresistive device MTJ, and a bit line 120b.

For example, the substrate 102 may include a silicon substrate. The gate trench GT may be formed in the form described with reference to FIG. 2D. A first source/drain area SD1 may be formed at one side of the gate line stack GLS and a second source/drain area SD2 may be formed at the other side of the gate line stack GLS. The first source/drain contact 112a may be electrically and physically connected to the first source/drain area SD1. The source line 118 may be electrically and physically connected to the first source/drain contact 112a.

A landing pad 114 may be electrically and physically connected to the second source/drain contact 112b. A via 116 may be electrically and physically connected to the landing pad 114. The bypass line 120a may be physically connected to the landing pad 114 through the via 116. The magnetoresistive device MTJ may be located between the bypass line 120a and the bit line 120b. The magnetoresistive device MTJ may include a lower magnetic layer 122a, a tunneling layer 124, and an upper magnetic layer 122b. The lower magnetic layer 122a may be electrically and physically connected to the bypass line 120a. The upper magnetic layer 122b may be electrically and physically connected to the bit line 120b. The lower magnetic layer 122a and the upper magnetic layer 122b each may be formed in multilayers. The lower magnetic layer 122a and the upper magnetic layer 122b may include a ferroelectric material. For example, the ferroelectric material may include NiFe, CoFe, NiFeB, CoFeB, NiFeSiB, or CoFeSiB. The tunneling layer 124 may include $AlO_x$, $Fe_3O_4$, or MgO.

Figure 4:
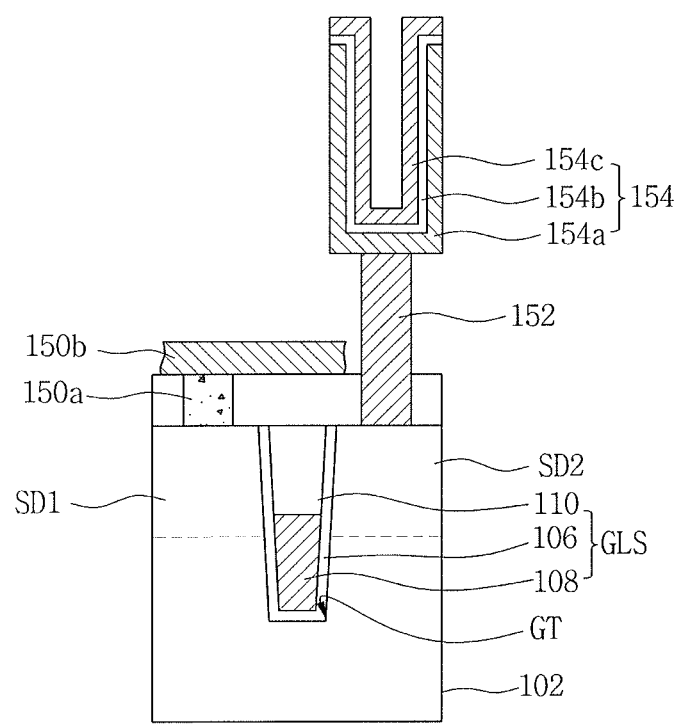
FIG. 4 illustrates a schematic cross-sectional view of a dynamic random access memory device including a switching device in accordance with an embodiment.

FIG. 4 illustrates a schematic cross-sectional view of a dynamic random access memory (DRAM) device including a switching device in accordance with an embodiment.

Referring to FIG. 4, a dynamic random access memory device 100b in accordance with an embodiment may include the substrate 102, the gate trench GT, the gate line stack GLS, the first source/drain area SD1, the second source/drain area SD2, a bit plug 150a, a bit line 150b, a buried contact 152, and a capacitor 154. For example, the substrate 102 may include a silicon substrate. The gate trench GT may be formed in the form described with reference to FIG. 2D.

The first source/drain area SD1 may be formed at one side of the gate line stack GLS and the second source/drain area SD2 may be formed at the other side of the gate line stack GLS. The bit plug 150a may be electrically and physically connected to the first source/drain area SD1. The bit line 150b may contact the bit plug 150a. The buried contact 152 may be electrically and physically connected to the second source/drain area SD2. The capacitor 154 may include a lower electrode 154a, a dielectric layer 154b, and an upper electrode 154c. The buried contact 152 may be electrically and physically connected to the capacitor 154.

A memory device including the buried gate line stack GLS in accordance with the embodiment is not limited to the above-described devices.

Hereinafter, a method of fabricating a memory device in accordance with an embodiment will be described with reference to the drawings of a process.

FIGS. 5A to 10A illustrate cross-sectional views showing a process flow taken along line I-I' of FIG. 1 in accordance with an embodiment, and FIGS. 5B to 10B illustrate perspective views showing the process flow in accordance with the embodiment and correspondence to respective FIGS. 5A to 10A. FIG. 9C illustrates a perspective view showing that an isolation layer is exposed.

Figure 5A:
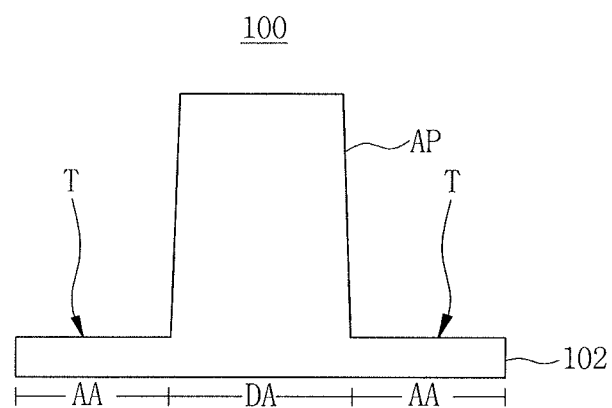
FIGS. 5A, 6A, 7A, 8A, 9A, and 10A illustrate cross-sectional views of a process flow taken along line I-I' shown in FIG. 1 in accordance with an embodiment.
Figure 5B:
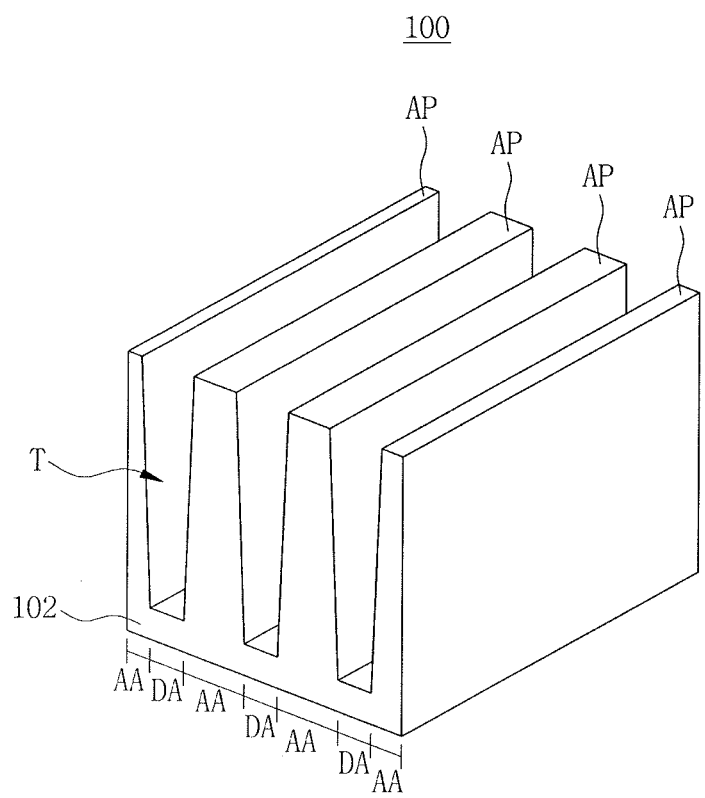
FIGS. 5B, 6B, 7B, 8B, 9B, and 10B illustrate perspective views of a process flow in accordance with an embodiment.

Referring to FIGS. 5A and 5B, a method of fabricating the memory device 100 in accordance with an embodiment may include forming the trenches T on the substrate 102.

The forming of the trenches T may include defining the active areas AA and the isolation areas DA on the substrate 102, and recessing a surface of the substrate 102 corresponding to the isolation areas DA. All the trenches T may extend in the first direction and may be spaced apart in the second direction perpendicular to the first direction. By forming the trenches T, a plurality of patterns which protrude from the substrate 102 may be formed. Hereinafter, the patterns are referred to as the active patterns AP. An inner side wall of the trench T may be a side wall of the active pattern AP.

Figure 6A:
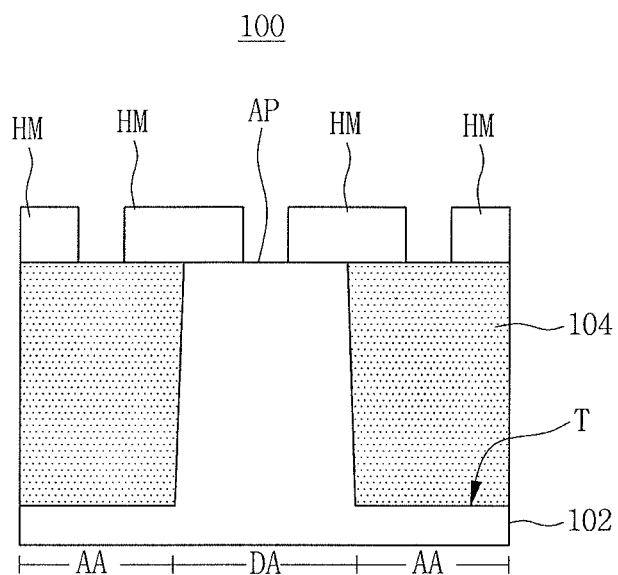
Figure 6B:
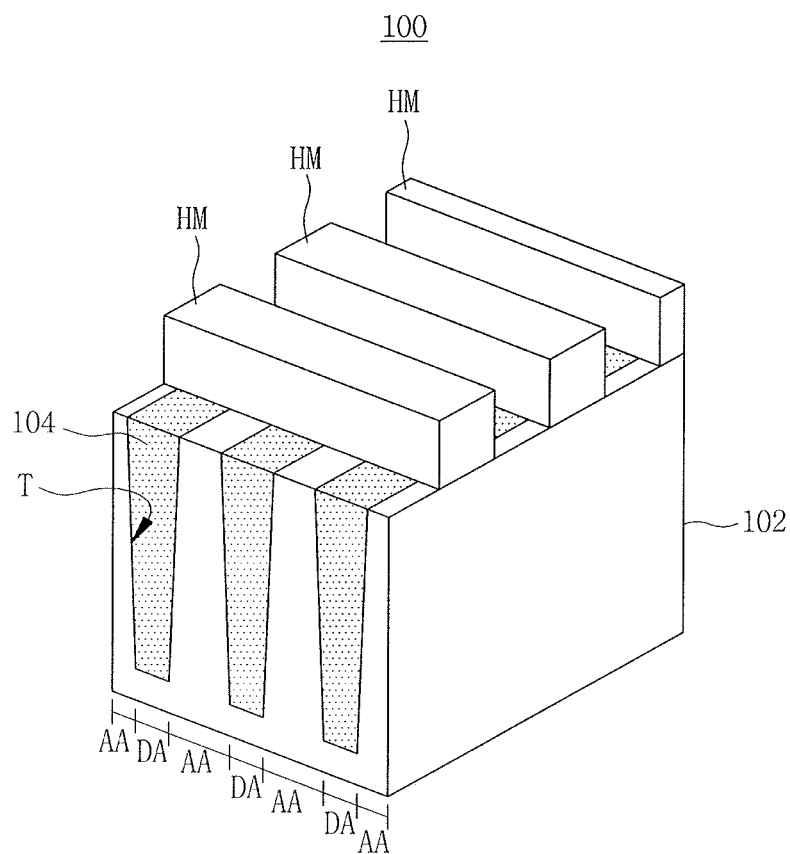
Figure 7A:
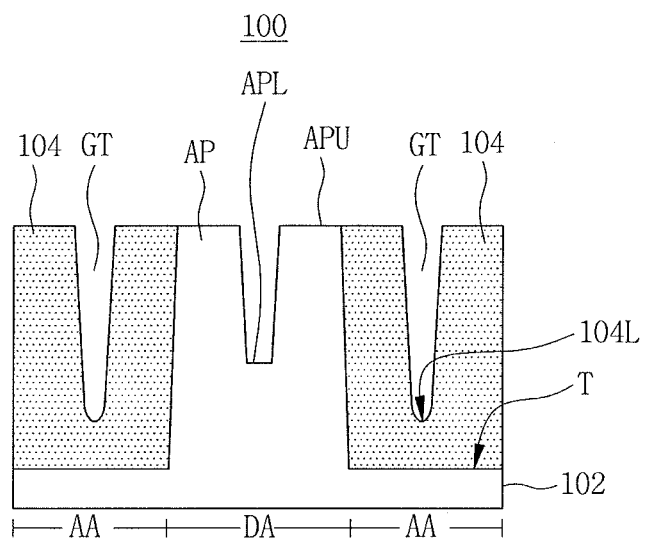
Figure 7B:
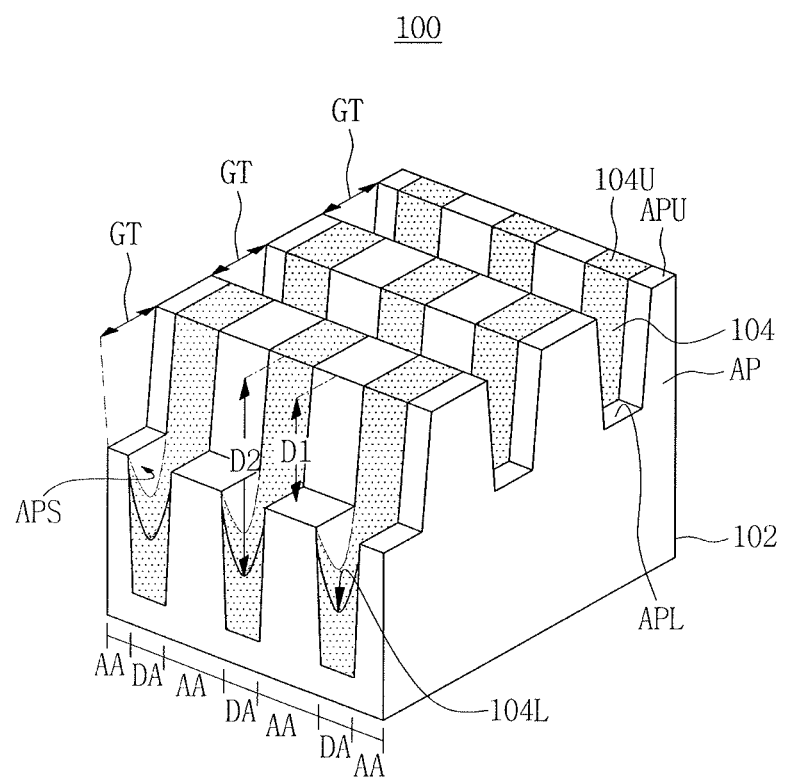

Referring to FIGS. 6A and 6B, the method of fabricating the memory device 100 in accordance with the embodiment may include forming the isolation layers 104 which fills the trenches T, and forming hard masks HM on a surface of the isolation layers 104.

The forming of the isolation layers 104 may include depositing an insulating material on an entire surface of the substrate 102 in which the trenches T are formed and performing a planarization process. Upper surfaces of the active patterns AP may be at the same level with upper surfaces of the isolation layers 104. The hard masks HM may extend in the second direction. The hard masks HM may be spaced apart in the first direction by a predetermined interval.

The isolation layers 104 may include silicon oxide ($SiO_2$). The hard masks HM may include a material having an etch selectivity with respect to the active patterns AP and the isolation layers 104. For example, the hard masks HM may include silicon nitride ($SiN_x$).

The hard masks HM are not removed and thus, are present in a subsequent process, however, descriptions for them will be omitted.

Referring to FIGS. 7A, 7B, 6B, 2C, and 2D, the method of fabricating the memory device 100 in accordance with the embodiment may include forming the gate trenches GT.

The forming of the gate trenches GT may include recessing the upper surfaces of the active patterns AP and the isolation layers 104 exposed between the hard masks HM. Since the isolation layers 104 and the active pattern AP include different materials, the isolation layers 104 and the active pattern AP may have different etch rates. In detail, etched depths of the isolation layers 104 and active patterns AP may be different. In more detail, a second depth D2 of the gate trench GT formed in the isolation layers 104 may be greater than a first depth D1 of the gate trench GT formed in the active pattern AP.

Referring again to FIGS. 2B and 2C, the gate trench GT is formed to cross the active patterns AP and the isolation layers 104, and thus the active patterns AP and the isolation layers 104 may have a plurality of spaced-apart upper surfaces APU and 104U. The active patterns AP and the isolation layers 104 each may include a plurality of concave parts CC1 and CC2 and convex parts CV1 and CV2. Surfaces of the convex parts CV1 and CV2 may be the spaced-apart upper surfaces APU and 104U of the active patterns AP and the isolation layers 104, respectively.

Bottoms APL and 104L of the concave parts CC1 and CC2 of the active patterns AP and the isolation layers 104 may be bottoms of the gate trenches GT. In this case, the bottom APL of the concave part CC1 formed in the active pattern AP may be formed in a flat shape and the bottom 104L of the concave part CC2 formed in the isolation layers 104 may be a concave curved shape.

In this case, the isolation layers 104 may remain on the side surfaces APS of the active pattern AP, which contact the side surfaces of the isolation layers 104, are perpendicular to the bottom of the concave part CC2, and extend in a bottom direction of the trench T, without completely being removed, and the isolation layers 104 may not be etched to an intended depth. Therefore, the depth of the gate trench GT formed in the isolation layers 104 may be insufficiently deep and a width of the gate trench GT may be narrower.

Figure 8A:
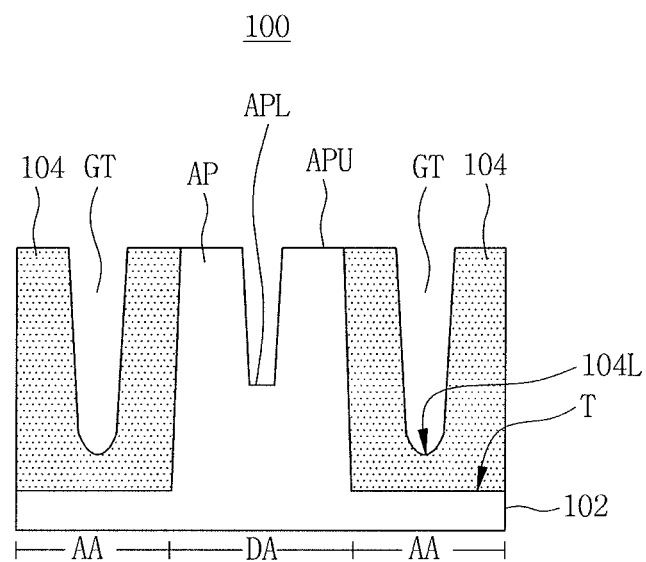
Figure 8B:
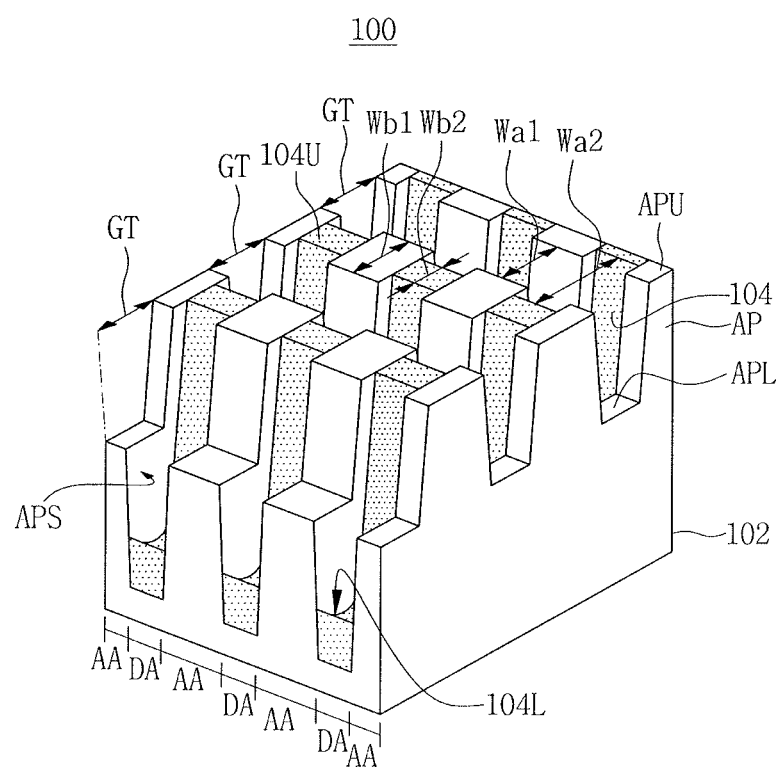

Referring to FIGS. 8A and 8B, the method of fabricating the memory device 100 in accordance with the embodiment may include selectively cleaning the gate trenches GT formed in the isolation layers 104.

The cleaning of the gate trenches GT may include a dry cleaning process or a wet cleaning process. For example, an exemplary removal of a silicon oxide layer (isolation layers 104) through a plasma dry cleaning process (dry cleaning process) will be described below. That is, the plasma dry cleaning process may be a process of removing the silicon oxide layer (isolation layers 104) through a reduction reaction.

The plasma dry cleaning process may use $NF_3$ or $NH_3$ gas for the reduction reaction. $NF_3$, $NH_3$, or Ar gas is injected into a plasma generation device, excited to generate plasma, and the generated plasma is supplied to a surface of the substrate 102. The oxide layer of the substrate 102 may be reduced through the plasma supplied to the surface of the substrate 102 using the following Reaction formula.

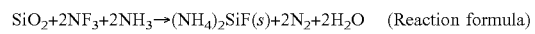

$$SiO_2 + 2NF_3 + 2NH_3 \rightarrow (NH_4)_2SiF(s) + 2N_2 + 2H_2O \quad \text{(Reaction formula)}$$

In the above-described Reaction formula, the products except $(NH_4)_2SiF(s)$ in a solid form may be in gas forms. The $(NH_4)_2SiF(s)$ in the solid form may be changed into $(NH_4)_2SiF(g)$ in the gas form through a heat treatment.

The isolation layers 104 may be removed through the above-described cleaning process. Therefore, a width and depth of the gate trench GT formed in the isolation layers 104 may be increased. Therefore, the bottom 104L of the gate trench GT corresponding to the isolation layers 104 may be further lowered.

Further, the gate trench GT may have the first width Wa1 and the second width Wa2. The first width Wa1 of the gate trench GT may be a width of a part formed by recessing the active pattern AP. The second width Wa2 may be a width of a part formed by recessing and cleaning the isolation layers 104. The second width Wa2 may be greater than the first width Wa1. The upper surface APU of the active pattern AP and the surface 104U of the convex part of the isolation layers 104 may be formed to be alternately arranged along a longitudinal direction of the gate trench GT. Therefore, the width Wb1 of the upper surface APU of the active pattern AP and the width Wb2 of the upper surface 104U of the isolation layers 104 parallel thereto, may be changed according to change in the width of the gate trench GT. In detail, the width Wb1 of the upper surface APU of the active pattern AP may be greater than the width Wb2 of the upper surface 104U of the isolation layers 104 parallel thereto.

Further, residues of the isolation layers 104, which remain on the side surfaces APS of the active pattern AP inside the gate trench GT, may be completely removed through the cleaning process.

Figure 9A:
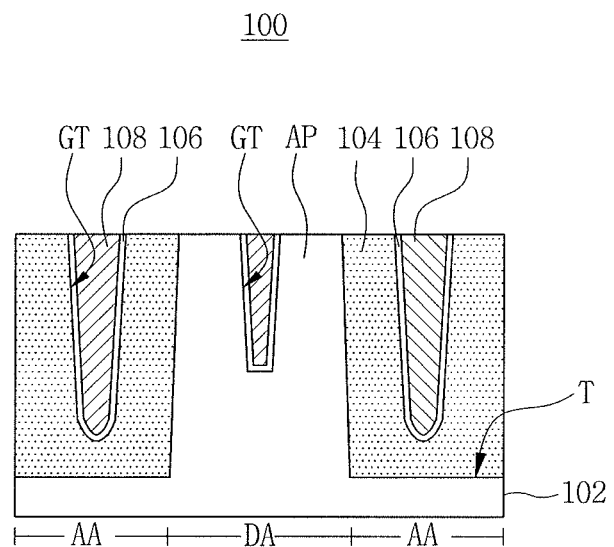
Figure 9B:
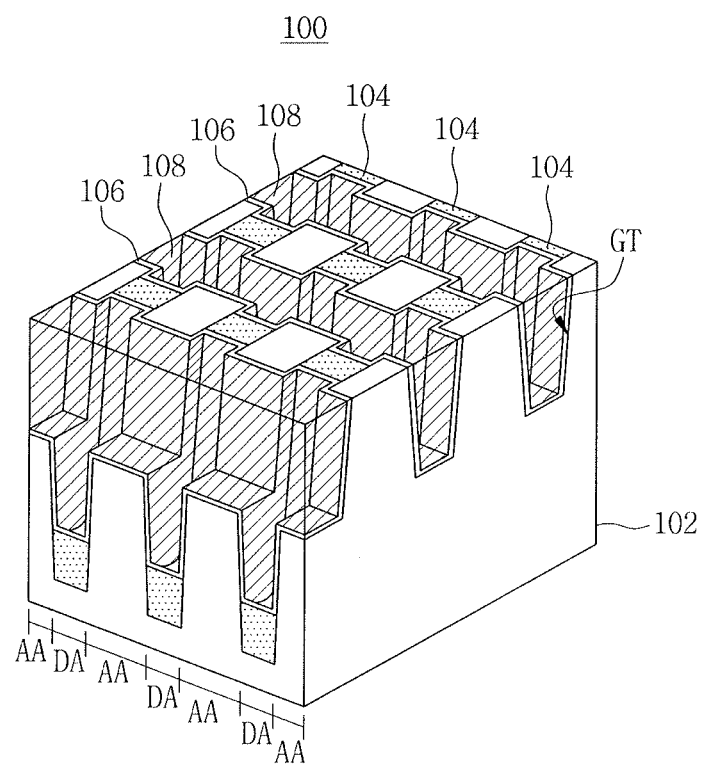
Figure 9C:
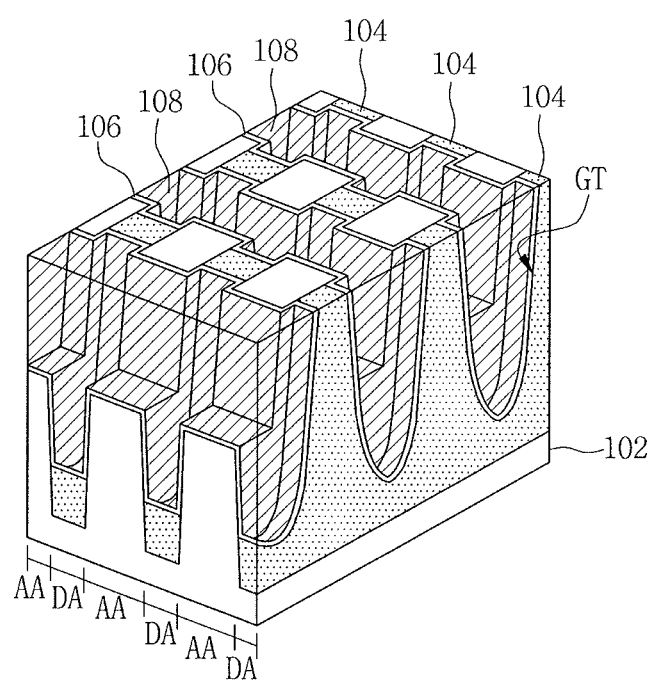
FIG. 9C illustrates a perspective view of an exposed isolation layer in accordance with an embodiment.
Figure 10A:
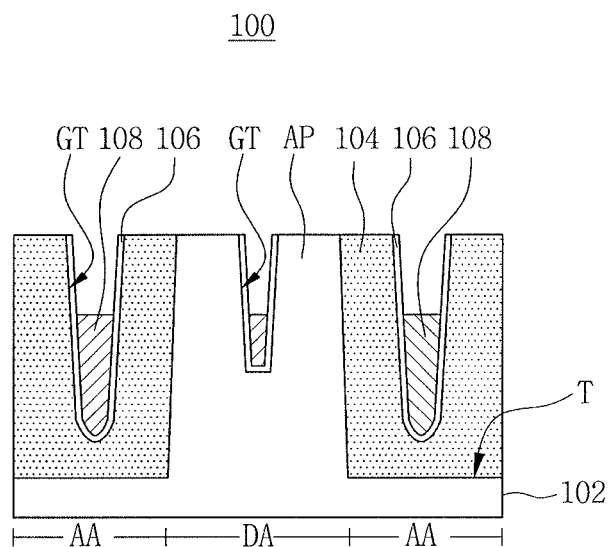
Figure 10B:
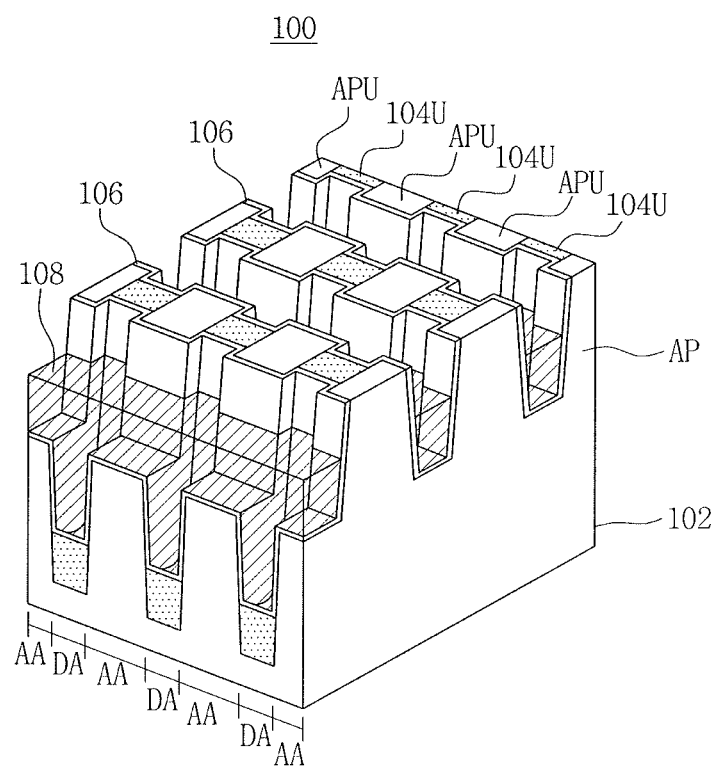

FIG. 9C illustrates a perspective view of the memory device 100 in accordance with the embodiment in which the isolation layers 104 is exposed.

Referring to FIGS. 9A to 9C, the method of fabricating the memory device 100 in accordance with the embodiment may include forming the gate insulating layer 106 and the gate line 108 in the gate trench GT.

The gate insulating layer 106 may be conformally formed along the inner wall of the gate trench GT. The gate line 108 may be conformally formed along a surface of the gate insulating layer 106 and may fill the gate trench GT.

Referring to FIG. 9C, since a surface area of the inner wall of the gate trench GT formed in the isolation layers 104 is increased through the previously performed cleaning process, a contact area of the gate insulating layer 106 which contacts the gate trench GT and the gate line 108 which contacts the gate insulating layer 106 may be increased compared with that of the conventional method. Further, a volume of the gate line 108 which fills the gate trench GT may also be increased.

For example, the gate insulating layer 106 may include silicon oxide ($SiO_2$). In another example, the gate insulating layer 106 may include, e.g., a high-k dielectric. The gate line 108 tungsten (W), aluminum (Al), copper (Cu), or nickel (Ni).

A gate barrier layer may be further formed between the gate insulating layer 106 and the gate line 108. The gate barrier layer may include a conductive material.

Referring to FIGS. 10A, 10B, 2A, and 2B, the method of fabricating the memory device 100 in accordance with the embodiment may include recessing the gate line 108 and forming the gate capping layer 110 on a recessed surface of the gate line 108.

The recessing of the gate line 108 may include removing the gate line 108 by a predetermined depth from the surface. The gate capping layer 110 may be stacked on the recessed surface of the gate line 108. The surface of the gate capping layer 110 may be at the same level with the spaced-apart upper surface APU of the active pattern AP and the spaced-apart upper surface 104U of the isolation layers 104. The gate capping layer 110 may include, e.g., silicon oxide ($SiO_2$).

Figure 11:
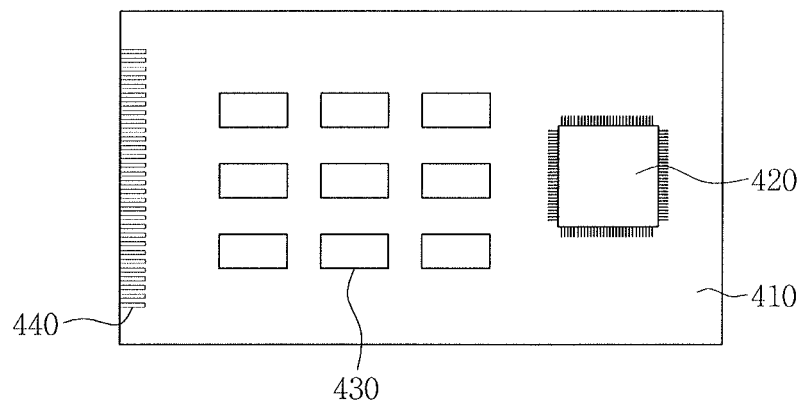
FIG. 11 illustrates a conceptual view of a semiconductor module in accordance with an embodiment including a memory device fabricated according to embodiments.

FIG. 11 illustrates a conceptual view of a semiconductor module in accordance with an embodiment.

Referring to FIG. 11, a semiconductor module 400 in accordance with the embodiment may include semiconductor devices 430 mounted on a semiconductor module substrate 410. The semiconductor devices 430 may include at least one of the memory devices 100a and 100b according to the various embodiments of the inventive concept. The semiconductor module 400 may further include a microprocessor 420 mounted on the semiconductor module substrate 410. Input/output terminals 440 may be disposed on at least one side of the semiconductor module substrate 410. The semiconductor module 400 may include a memory card or a solid state drive (SSD).

Figure 12:
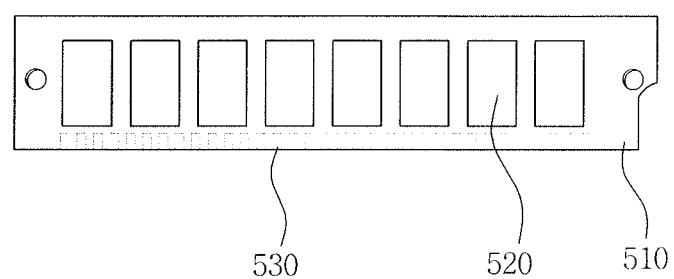
FIG. 12 illustrates a conceptual view of a semiconductor module in accordance with another embodiment including a memory device according to embodiments.

FIG. 12 illustrates a conceptual view of a module in accordance with an embodiment. Referring to FIG. 12, a module 500 in accordance with the embodiment may include memory devices 520 mounted on a module substrate 510. The memory devices 520 may include at least one of the memory devices 100a and 100b according to the various embodiments of the inventive concept. The module 500 may further include a microprocessor mounted on the module substrate 510. Input/output terminals 530 may be disposed on at least one side of the module substrate 510.

Figure 13:
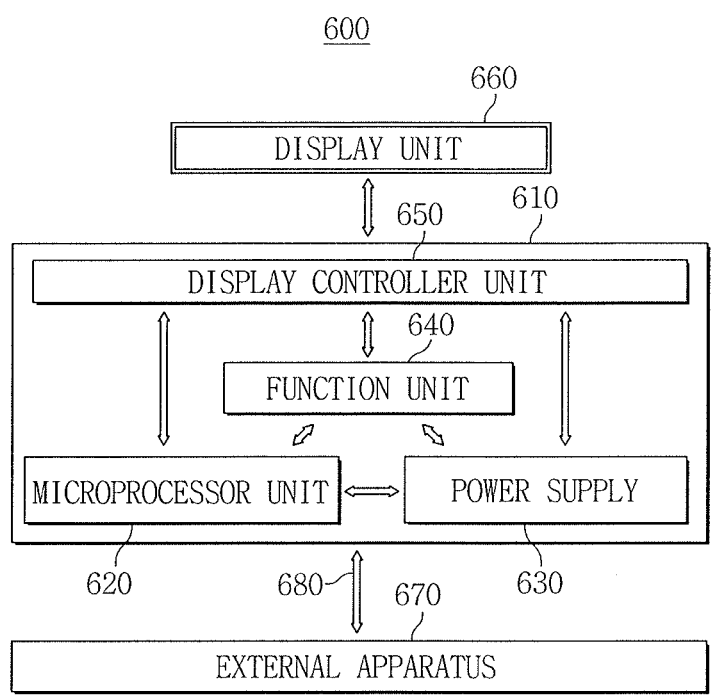
FIG. 13 illustrates a conceptual block diagram of an electronic system in accordance with an embodiment including a memory device according to embodiments.

FIG. 13 illustrates a conceptual block diagram of an electronic system in accordance with an embodiment including the memory device fabricated according to the embodiments.

Referring to FIG. 13, the memory devices 100a and 100b fabricated according to the embodiments may be applied to an electronic system 600. The electronic system 600 may include a body 610, a microprocessor unit 620, a power supply 630, a function unit 640, and/or a display controller unit 650.

The body 610 may be a system board or a motherboard having a PCB, etc. The microprocessor unit 620, the power supply 630, the function unit 640, and the display controller unit 650 may be installed or mounted in the body 610. A display unit 660 may be disposed on an upper surface of the body 610 or outside the body 610. For example, the display unit 660 may be disposed on a surface of the body 610 to display an image processed by the display controller unit 650. The power supply 630 may receive a constant voltage from an external power supply, divide the voltage into various voltage levels, and supply those voltages to the microprocessor unit 620, the function unit 640, the display controller unit 650, etc. The microprocessor unit 620 may receive a voltage from the power supply 630 to control the function unit 640 and the display unit 660.

The function unit 640 may perform various functions of the electronic system 600. For example, when the electronic system 600 is a mobile electronic product such as a cellular phone, etc., the function unit 640 may include various components which perform wireless communication functions such as dialing, image output to the display unit 660, or voice output to a speaker through communication with an external apparatus 670, and when a camera is included, it may serve as an image processor. In another embodiment, when the electronic system 600 is connected to a memory card to expand the capacity, the function unit 640 may be a memory card controller. The function unit 640 may exchange signals with the external apparatus 670 through a wired or wireless communication unit 680. Further, when the electronic system 600 requires a Universal Serial Bus (USB) to extend the functions, the function unit 640 may serve as an interface controller. The memory devices 100a and 100b fabricated according to the embodiments may be included in the function unit 640.

Figure 14:
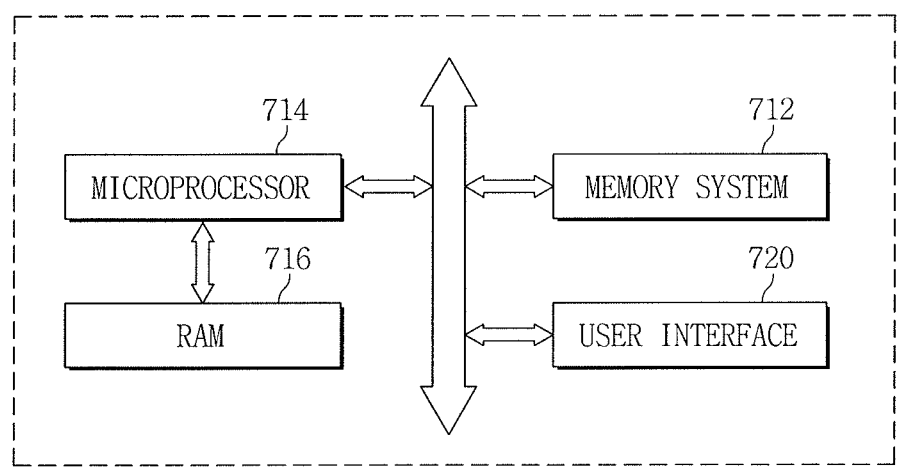
FIG. 14 illustrates a schematic block diagram of an electronic system in accordance with another embodiment including a memory device according to embodiments.

FIG. 14 illustrates a schematic block diagram showing an electronic system in accordance with another embodiment including the memory device fabricated according to the embodiments.

Referring to FIG. 14, n electronic system 700 may include the memory devices 100a and 100b fabricated according to the embodiments.

The electronic system 700 may be applied to a mobile device or a computer. For example, the electronic system 700 may include a memory system 712, a microprocessor 714, a random access memory (RAM) 716, and a user interface 720, which perform data communication using a bus. The microprocessor 714 may program and control the electronic system 700. The RAM 716 may be used as an operational memory of the microprocessor 714. For example, the microprocessor 714 or the RAM 716 may include one of the memory devices 100a and 100b in accordance with the embodiments. The microprocessor 714, the RAM 716, and/or other components may be assembled within a single package. The user interface 720 may be used to input data to the electronic system 700, or output data from the electronic system 700. The memory system 712 may store operational codes of the microprocessor 714, data processed by the microprocessor 714, or data received from the outside. The memory system 712 may include a controller and a memory.

By way of summation and review, in order to improve short channel effects, a structure for burying a gate electrode so as to ensure a sufficient channel length has been proposed. However, when a gate trench for burying the gate electrode is formed, etching defects occur on an insulating layer while a silicon layer and the insulating layer are simultaneously etched. Due to the etching defects, a sufficient width and depth of the gate trench formed in the insulating layer may not be ensured. Further, a surface area of the gate electrode which fills the gate trench is reduced, and thus there are problems in that a channel resistance is increased and a short channel effect occurs.

In contrast, according to the memory devices in accordance with the embodiments, when a gate trench formed to cross a silicon layer and an insulating layer is formed, an inner surface of a trench formed in the insulating layer can be expanded by performing a process of cleaning only the insulating layer. A surface area of a gate electrode is increased as the inner surface of the trench is expanded, and thus a channel resistance of the memory device can be reduced and a short channel effect cannot occur. Therefore, a switching characteristic of the memory device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a substrate including active areas and isolation areas;
trenches in the isolation areas;
active patterns in the active areas, the active patterns protruding from the substrate;
isolation layers filling the trenches;
gate trenches crossing the active patterns and the isolation layers;
gate line stacks filling the gate trenches, a first width of the gate trench in the isolation layer being greater than a second width of the gate trench in the active pattern, wherein a bottom of each gate trench in the active patterns is flat, and an entire bottom of each gate trench in the isolation layers is curved; and
a sidewall of the active pattern between the flat and curved bottoms is covered by a gate insulating layer of a gate line stack.

2. The device as claimed in claim 1, wherein the gate line stack includes:
a gate insulating layer conformal along an inside of the gate trench;
a gate line having a bottom conformal along a surface of the gate insulating layer, the gate line filling a lower part of the gate trench; and
a gate capping layer covering an upper surface of the gate line and filling an upper part of the gate trench.

3. The device as claimed in claim 1, wherein the active patterns and the isolation layers each have a plurality of upper surfaces spaced apart by the gate trenches, and the upper surfaces of the active patterns and the upper surfaces of the isolation layers are alternately disposed along a longitudinal direction of the gate trench.

4. The device as claimed in claim 3, wherein a width of the upper surface of the active pattern is greater than a width of the upper surface of the isolation layer parallel thereto.

5. The device as claimed in claim 1, wherein the gate trench includes a first bottom defined by a surface of the active patterns and a second bottom defined by a surface of the isolation layer.

6. The device as claimed in claim 5, wherein the first bottom is located at a higher level than the second bottom relative to the substrate.

7. The device as claimed in claim 6, wherein the second bottom is curved downward more than the first bottom, the second bottom being the bottom of each gate trench in the isolation layers and is curving along an entire width of the flat bottom of the first bottom.

8. The device as claimed in claim 1, further comprising:
a first source/drain area on the active pattern in contact with a first side of the gate line stack; and
a second source/drain area on the active pattern in contact with a second side of the gate line stack.

9. The device as claimed in claim 8, further comprising:
a bit line electrically connected to the first source/drain area; and
a storage capacitor electrically connected to the second source/drain area.

10. The device as claimed in claim 9, further comprising a buried contact between the second source/drain area and the storage capacitor.

11. The device as claimed in claim 8, further comprising:
a source line in electrical contact with the first source/drain area; and
a magnetoresistive device in contact with the second source/drain area.

12. The device as claimed in claim 11, wherein the magnetoresistive device includes a lower magnetic layer, a tunneling layer, and an upper magnetic layer.

13. The device as claimed in claim 12, further comprising a bit line electrically connected to the upper magnetic layer.

14. A memory device, comprising:
a substrate including active areas and isolation areas;
trenches in the isolation areas along a first direction;
active patterns in the active areas along the first direction, the active areas protruding from the substrate;
isolation layers filling the trenches;
gate trenches crossing the active patterns and the isolation layers in a second direction perpendicular to the first direction, widths of the gate trenches in the first direction in the isolation layers being larger than widths of the gate trenches in the first direction in the active patterns;
gate line stacks filling the gate trenches, wherein a bottom of each gate trench in the active patterns is flat, and an entire bottom of each gate trench in the isolation layers is curved; and a sidewall of the active pattern between the flat and curved bottoms is covered by a gate insulating layer of a gate line stack.

15. The device as claimed in claim 14, wherein the isolation layers and the active patterns alternate in the second direction, the isolation layers exposing sidewalls of the active patterns.

16. The device as claimed in claim 15, wherein the gate trenches are deeper in the isolation layers than in the active patterns, the isolation layers exposing sidewalls of the active patterns defining the gate trenches in the active patterns.

17. The device as claimed in claim 14, wherein a distance between a bottom of each gate trench in the isolation layers and the substrate is smaller than a distance between a bottom of each gate trench in the active patterns and the substrate.

\* \* \* \* \*